(12) United States Patent
Hiraide

(10) Patent No.: US 10,090,851 B2
(45) Date of Patent: Oct. 2, 2018

(54) SUCCESSIVE APPROXIMATION TYPE ANALOG-TO-DIGITAL (A/D) CONVERTER

(71) Applicant: OLYMPUS CORPORATION, Hachioji-shi, Tokyo (JP)

(72) Inventor: Shuzo Hiraide, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/814,955

(22) Filed: Nov. 16, 2017

(65) Prior Publication Data
US 2018/0083646 A1 Mar. 22, 2018

Related U.S. Application Data

(63) Continuation of application No. PCT/JP2015/067173, filed on Jun. 15, 2015.

(51) Int. Cl.
*H03M 1/00* (2006.01)
*H03M 1/38* (2006.01)
(Continued)

(52) U.S. Cl.
CPC ............. *H03M 1/38* (2013.01); *H01G 4/002* (2013.01); *H03M 1/1095* (2013.01); *H03M 1/26* (2013.01); *H03M 1/1004* (2013.01)

(58) Field of Classification Search
CPC ........ H03M 1/38; H03M 1/1095; H03M 1/26; H03M 1/004; H03M 1/468; H03M 1/1245; H01G 4/002
(Continued)

(56) References Cited

U.S. PATENT DOCUMENTS 8,059,020 B2\* 11/2011 Schatzberger ........ H03M 1/185
341/138
9,467,159 B1\* 10/2016 Tai ...................... H03M 1/1057
(Continued)

FOREIGN PATENT DOCUMENTS

JP 2010-45723 A 2/2010
JP 2013-168870 A 8/2013

OTHER PUBLICATIONS

Harpe et al., "A 26 μW 8 bit 10 MS/s Asynchronous SAR ADC for Low Energy Radios", IEEE Journal of Solid-State Circuits, vol. 46, No. 7, Jul. 2011, pp. 1585-1595. (11 pages).
(Continued)

*Primary Examiner* — Khai M Nguyen
(74) *Attorney, Agent, or Firm* — Westerman, Hattori, Daniels & Adrian, LLP

(57) ABSTRACT

A sampling circuit in a successive approximation type analog-to-digital (A/D) converting device samples a pair of analog signals constituting a differential input signal. A capacitor circuit reflects a signal level of a reference signal in the pair of analog signals through an attenuation capacitance unit and a binary capacitance unit to generate a pair of voltage signals. A comparison circuit compares the pair of voltage signals. A control circuit determines a value of each bit of a digital signal on the basis of the result of the comparison and reflects the value in the reference signal. The attenuation capacitance unit includes a fixed capacitance unit connected between a signal node at which the sampled analog signals are held and a predetermined potential node and a variable capacitance unit connected between the signal node and the predetermined potential node in parallel with the fixed capacitance unit.

7 Claims, 9 Drawing Sheets

(51) Int. Cl.
*H03M 1/10* (2006.01)
*H01G 4/002* (2006.01)
*H03M 1/26* (2006.01)

(58) Field of Classification Search
USPC .................................. 341/118, 120, 163, 172
See application file for complete search history.

(56) References Cited

U.S. PATENT DOCUMENTS

2010/0039303 A1   2/2010   Tsukamoto
2011/0057823 A1   3/2011   Harpe

OTHER PUBLICATIONS

International Search Report dated Sep. 1, 2015, issued in counterpart application No. PCT/JP2015/067173, w/ English translation. (2 pages).

* cited by examiner

SUCCESSIVE APPROXIMATION TYPE ANALOG-TO-DIGITAL (A/D) CONVERTER

The present application is a continuation application based on International Patent Application No. PCT/JP2015/067173 filed on Jun. 15, 2015, the content of which is incorporated by reference herein.

BACKGROUND OF THE INVENTION

Field of the Invention

The present invention relates to a successive approximation type A/D converter.

Description of Related Art

As an analog-to-digital (A/D) converter having low power consumption, for example, the successive approximation type A/D converter of the differential input asynchronous method disclosed in following Non-Patent Document 1 is known. In this type of successive approximation type A/D converter an analog signal input as a differential input signal is held by a sample-and-hold circuit. A comparison voltage signal is generated by reflecting a reference signal in the held analog signal through a capacitance circuit. A successive approximation logic circuit determines a value (0 or 1) of each bit from a most significant bit (MSB) to a least significant bit (LSB) of a digital signal corresponding to the differential input signal in accordance with a binary search algorithm on the basis of the comparison voltage signal and feeds back the determined value of each bit to the reference signal.

Non-Patent Document 1: "A 26 W 8 bit 10 MS/s Asynchronous SAR ADC for Low Energy Radios," IEEE JOURNAL OF SOLID-STATE CIRCUITS, Vol. 46, No. 7 JULY 2011 pp 1585 to 1595

A large part of a successive approximation type A/D converter can be constituted of digital circuits without using analog circuits such as operational amplifiers. For this reason, a compact successive approximation type A/D converter can be realized using a fine complementary metal oxide semiconductor (CMOS) process and power consumption can be reduced. In view of enabling such low power consumption and miniaturization, a successive approximation type A/D converter is used for, for example, a system large scale integration (LSI) of a portable device and the like.

SUMMARY OF THE INVENTION

A successive approximation type A/D converter according to a first aspect of the present invention includes a sampling circuit, a capacitance circuit, a comparison circuit, and a control circuit. The sampling circuit samples a pair of analog signals constituting a differential input signal. The capacitance circuit includes an attenuation capacitance unit and a binary capacitance unit connected to a signal node configured to hold the pair of analog signals sampled by the sampling circuit. The capacitance circuit reflects a signal level of a reference signal in the pair of analog signals through the attenuation capacitance unit and the binary capacitance unit to generate a pair of voltage signals. The comparison circuit compares one signal and the other signal constituting the pair of voltage signals. The control circuit sequentially determines a value of each bit of a digital signal including a plurality of bits and corresponding to the binary capacitance unit using a binary search method on the basis of the comparison result by the comparison circuit to reflect the value of each bit of the digital signal in the reference signal. The attenuation capacitance unit includes a fixed capacitance unit connected between a signal node configured to hold the pair of analog signals sampled by the sampling circuit and a predetermined potential node, and a variable capacitance unit connected between the signal node and the predetermined potential node in parallel with the fixed capacitance unit.

According to a second aspect of the present invention, in the successive approximation type A/D converter according to the first aspect, a capacitance of the fixed capacitance unit may be smaller than a capacitance of the binary capacitance unit, combination of the capacitance of the binary capacitance unit, a parasitic capacitance generated in a common metal wiring of the binary capacitance unit, and an input capacitance of the comparison circuit may be smaller than a combined capacitance of the fixed capacitance unit and the variable capacitance unit.

According to a third aspect of the present invention, in the successive approximation type A/D converter according to the first or second aspect, the binary capacitance unit may include a plurality of capacitances, each of which is configured to be weighted by a binary number and a plurality of switches, each of which is connected in series with one of the plurality of capacitances.

According to a fourth aspect of the present invention, the successive approximation type A/D converter according to the third aspect further includes an attenuation capacitance control unit configured to control a capacitance value of the variable capacitance unit by selectively controlling on and off states of the plurality of switches such that a full scale range of the voltage signals corresponds to a full scale range of the digital signal.

According to a fifth aspect of the present invention in the successive approximation type A/D converter according to the first to fourth aspects, the attenuation capacitance unit may include a plurality of unit capacitance and the binary capacitance unit may include a plurality of unit capacitance. A shape and a structure of the unit capacitance included in the attenuation capacitance unit may be set in accordance with a shape and a structure of the unit capacitance included in the binary capacitance unit respectively.

DETAILED DESCRIPTION OF THE INVENTION

A first embodiment of the present invention be described below with reference to the drawings.

Figure 1:
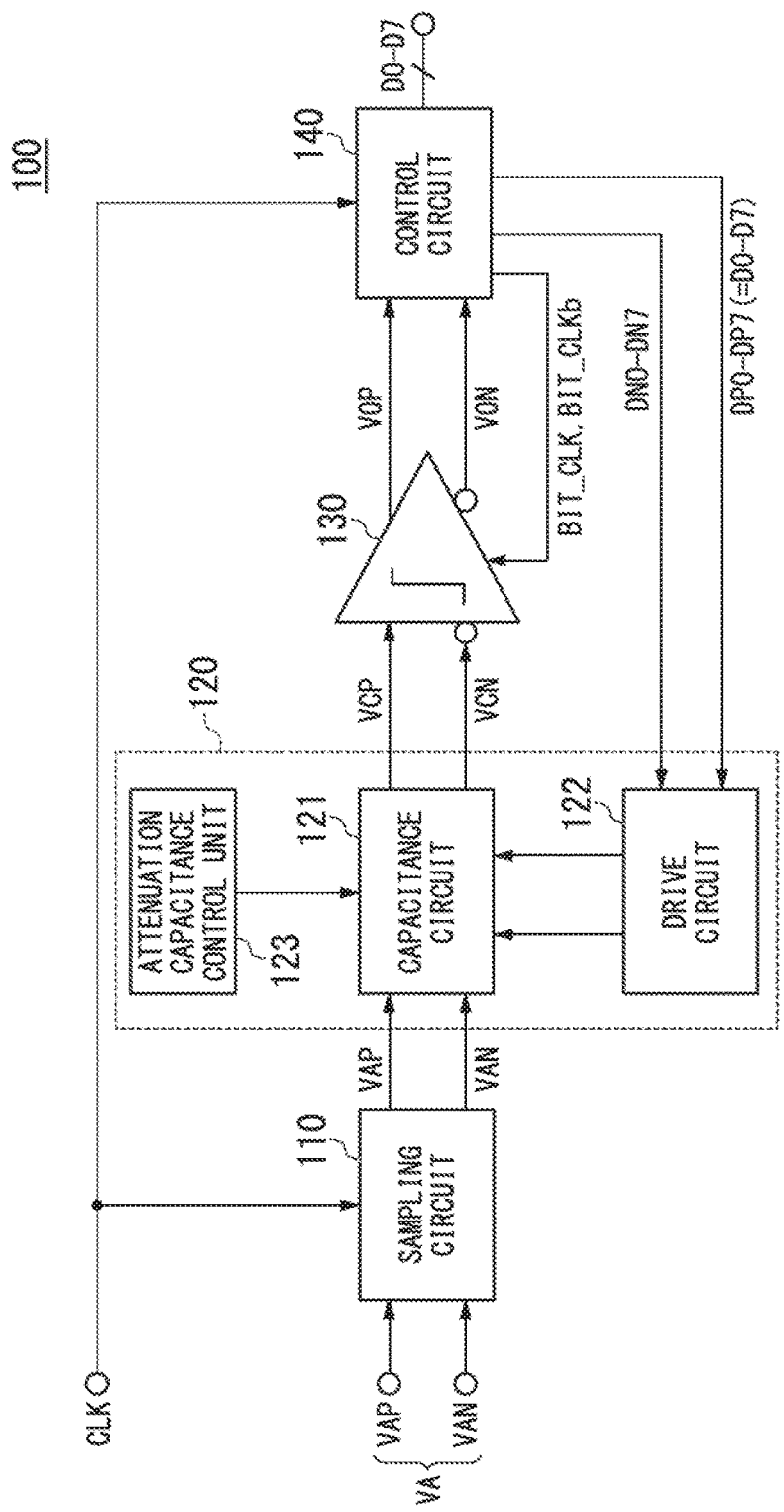
FIG. 1 is a block diagram showing an example of a constitution of a successive approximation type analog-to-digital (A/D) converter according to a first embodiment of the present invention.

FIG. 1 is a block diagram showing an example of a constitution of a successive approximation type analog-to-digital (A/D) converter 100 according to the first embodiment of the present invention.

Although the successive approximation type A/D converter 100 according to the first embodiment is an 8-bit output A/D converter, the present invention is not limited to such an example and the number of output bits of the successive approximation type A/D converter 100 can be arbitrarily set.

The successive approximation type A/D converter 100 includes a sampling circuit 110, a capacitive DAC circuit 120, a comparison circuit 130, and a control circuit 140.

The sampling circuit 110 is an element configured to track and hold a pair of analog signals VAP and VAN constituting a differential input signal VA, sample the analog signals VAP and VAN, and incorporate the sampled analog signals VAP and VAN into the successive approximation type A/D converter 100. An operation of the sampling circuit 110 is controlled oil the basis of a clock signal CLK.

The capacitive DAC circuit 120 is an element configured to generate a reference signal based on digital signals (D0 to D7) generated by the control circuit 140 and held by the sampling circuit 110 and subtract a reference signal from each of the sampled analog signals VAP and VAN to obtain cumulative residuals between the differential input signal VA and the 8-bit digital signals D0 to D7. The capacitive DAC circuit 120 outputs the subtraction results obtained by subtracting the reference signal from each of the analog signals VAP and VAN to the comparison circuit 130 as analog signals VCP and VCN (voltage signals) reflecting the cumulative residuals.

The comparison circuit 130 is an element configured to compare the analog signal VCP and the analog signal VCN input from the capacitive DAC circuit 120 and outputs digital signals VOP and VON indicating comparison results according to a magnitude relation thereof. To be specific, the comparison circuit 130 outputs a High level signal as a digital signal VOP and outputs a Low level signal as a digital signal VON when a signal level of the analog signal VCP is higher than a signal level of the analog signal VCN. On the contrary, the comparison circuit 130 outputs a Low level signal as a digital signal VOP and outputs a High level signal as a digital signal VON when the signal level of the analog signal VCP is lower than the signal level of the analog signal VCN. An operation of the comparison circuit 130 is controlled on the basis of an internal clock signal BIT_CLK and an inverted internal clock signal BIT_CLKb generated by the control circuit 140 which will be described below.

The control circuit 140 is an element which functions as a successive approximation register (SAR) logic circuit and sequentially determines a value of each bit of digital signals DP0 to DP7 and DN0 to DN7 corresponding to the digital signals VOP and VON indicating the comparison results using the comparison circuit 130 in accordance with a binary search algorithm (a binary search method). The control circuit 140 supplies the digital signals DP0 to DP7 and DN0 to DN7 corresponding to the digital signals VOP and VON to the capacitive DAC circuit 120. Therefore, the control circuit 140 reflects the value of each bit of the digital signals DP0 to DP7 and DN0 to DN7 in the reference signal. The control circuit 140 outputs the digital signals DP0 to DP7 as digital signals D0 to D7 indicating A/D conversion results. Furthermore, the control circuit 140 generates the internal clock signal BIT_CLK and the inverted internal clock signal BIT_CLKb used to control the comparison circuit 130 and supplies the internal clock signal BIT_CLK and the inverted internal clock signal BIT_CLKb to the comparison circuit 130. An operation of the control circuit 140 is controlled on the basis of the clock signal CLK. The control circuit 140 generates the internal clock signal BIT_CLK and the inverted internal clock signal BIT_CLKb when the clock signal CLK is at a High level.

The capacitive DAC circuit 120 includes a capacitance circuit 121, a drive circuit 122, and an attenuation capacitance control unit 123. Here, the capacitance circuit 121 is an element configured to subtract the reference signal from the analog signals VAP and VAN using charge redistribution between a plurality of capacitances to obtain the analog signals VCP and VCN indicating the cumulative residuals. The drive circuit 122 is an element configured to generate the reference signal on the basis of the digital signals DP0 to DP7 and DN0 to DN7 input from the control circuit 140 and drive the capacitance circuit 121. The attenuation capacitance control unit 123 is an element configured to control capacitance values of attenuation capacitances CHP and CHN, which will be described below, included in the capacitance circuit 121.

The successive approximation type A/D converter 100 sequentially obtains A/D conversion results one bit at a time from a most significant bit (D7) to a least significant bit (D0) of the digital signals D0 to D7. During such A/D conversion, every time the subtraction is performed by the capacitance circuit 121 of the capacitive DAC circuit 120, the comparison circuit 130 compares the voltage of the analog signal VCP and the voltage of the analog signal VCN which reflect the cumulative residuals until then.

Figure 2:
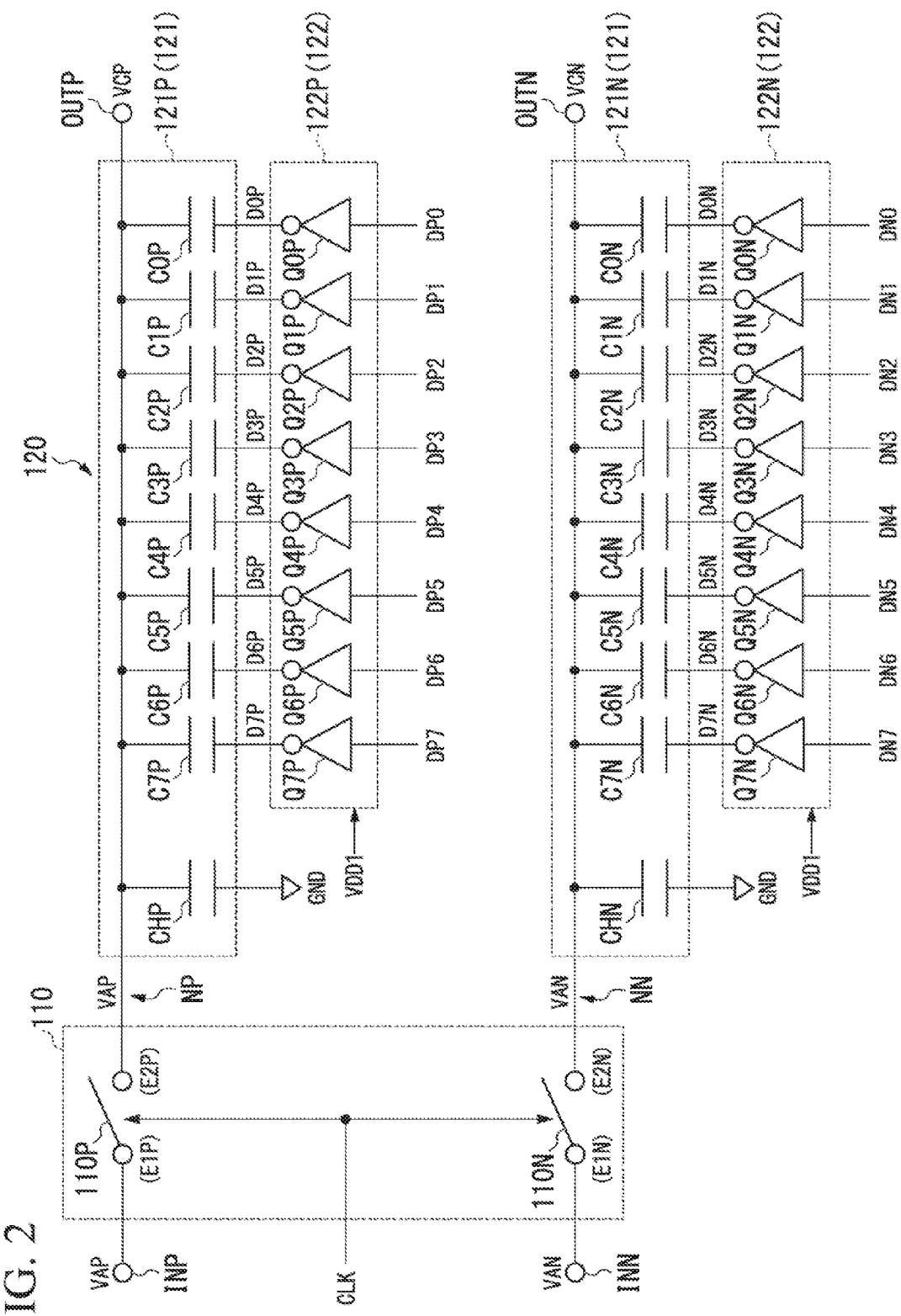
FIG. 2 is a circuit diagram showing an example of a constitution of a sampling circuit and a capacitive digital-to-analog converter (DAC) circuit included in the successive approximation type A/D converter according to the first embodiment of the present invention.

FIG. 2 is a circuit diagram showing an example of a constitution of the sampling circuit 110 and the capacitive digital-to-analog converter (DAC) circuit 120. Here, in FIG. 2, the attenuation capacitance control unit 123 shown in FIG. 1 serving as a constituent element of the capacitive DAC circuit 120 will be omitted.

The sampling circuit 110 includes switches 110P and 110N. The switch 110P causes a first terminal E1P and a second terminal E2P to electrically conduct each other when the switch 110P is in an on state and sets a state between the first terminal E1P and the second terminal E2P to a high impedance state when the switch 110P is in an off state. The analog signal VAP is input to the first terminal E1P of the switch 110P via a non-inverting input terminal INP. The switch 110P holds and samples the analog signal VAP in a capacitance unit 121P which will be described below when the switch 110P is switched from an on state to an off state. The switch 110P is switched between on and off states on the basis of the clock signal CLK.

The switch 110N causes a first terminal E1N and a second terminal E2N to electrically conduct each other when the switch 110N is in an on state and sets a state between the first terminal E1N and the second terminal E2N to a high impedance state when the switch 110N is in an off state. An analog signal VAN is input to the first terminal E1N of the switch 110N via an inverting input terminal INN. The switch 110N holds and samples the analog signal VAN in a capacitance unit 121N which will be described below when the switch 110N is switched from an on state to an off state. The switch 110N is switched between on and off states on the basis of the clock signal CLK.

The capacitance circuit 121 constituting the capacitive DAC circuit 120 is constituted of the capacitance units 121P and 121N. Among them, the capacitance unit 121P includes an attenuation capacitance CHP (an attenuation capacitance unit) and binary capacitances C0P to C7P (binary capacitance units). The attenuation capacitance CHP is connected between a signal node NP corresponding to a wiring connected to the second terminal E2P of the switch 110P and a ground GND. Furthermore, the binary capacitances C0P to C7P are connected between the signal node NP and an output unit of a drive unit 122P constituting the drive circuit 122. In other words, a first electrode included in each of the binary capacitances C0P to C7P is commonly connected to the signal node NP. Furthermore, a second electrode included in each of the binary capacitances C0P to C7P is connected to one of output units of inverters Q0P to Q7P constituting the drive unit 122P.

Here, the binary capacitances C0P to C7P are disposed to correspond to the digital signals DP0 to DP7 generated by the control circuit 140. Capacitance values of the binary capacitances C0P to C7P are different from each other. For example, a capacitance value of a capacitance C(n+1)P corresponding to a digital signal DP(n+1) is twice a capacitance value of a capacitance CnP corresponding to a digital signal DPn (n is an integer from 0 to 6). In other words, the capacitance values of the binary capacitances C0P to C7P are weighted by a binary number according to the order of each bit of the digital signals DP0 to DP7.

Similarly, the capacitance unit 121N includes an attenuation capacitance CHN and binary capacitances C0N to C7N. The attenuation capacitance CHN is connected between a signal node NN corresponding to a wiring connected to the second terminal E2N of the switch 110N and the ground GND. Furthermore, the binary capacitances C0N to C7N are connected between the signal node NN and an output unit of a drive unit 122N constituting the drive circuit 122. In other words, a first electrode included in each of the binary capacitances C0N to C7N is commonly connected to the signal node NN. Furthermore, a second electrode included in each of the binary capacitances C0N to C7N is connected to one of output units of inverters Q0N to Q7N constituting the drive unit 122N.

Note that capacitance values of the binary capacitances C0N to C7N are weighted by a binary number like the binary capacitances C0P to C7P.

Also, the capacitance values of the binary capacitances C0N to C7N constituting the capacitance unit 121N are respectively set to be the same as the capacitance values of the binary capacitances C0P to C7P constituting the capacitance unit 121P.

The drive circuit 122 constituting the capacitive DAC circuit 120 includes the drive units 122P and 122N. The drive unit 122P includes the inverters Q0P to Q7P. A first power supply voltage VDD1 is supplied to the inverters Q0P to Q7P as a power supply voltage. This means that amplitudes of reference signals D0P to D7P output from the inverters Q0P to Q7P are equal to that of the first power supply voltage VDD1. The inverters Q0P to Q7P are disposed to correspond to the digital signals DP0 to DP7 generated by the control circuit 140. Each bit of the digital signals DP0 to DP7 is input from the control circuit 140 to the inverters Q0P to Q7P. Furthermore, output units of inverters QP0 to QP7 are connected to the second electrodes of the binary capacitances C0P to C7P.

The inverters QP0 to QP7 invert the digital signals DP0 to DP7 input from the control circuit 140 to generate the reference signals D0P to D7P. A plurality of binary capacitances C0P to C7P included in the capacitance unit 121P subtract the reference signals D0P to D7P from the analog signal VAP by extracting charges based on the reference signals D0P to D7P from charges based on the analog signal VAP held in the attenuation capacitance CHP through charge redistribution. The capacitance unit 121P outputs the analog signal VCP serving as the subtraction result.

Similarly, the drive unit 122N includes the inverters Q0N to Q7N. The first power supply voltage VDD1 is supplied to the inverters Q0N to Q7N as a power supply voltage. This means that amplitudes of reference signals D0N to D7N output from the inverters Q0N to Q7N are equal to that of the first power supply voltage VDD1. The inverters Q0N to Q7N are disposed to correspond to the digital signals DN0 to DN7 generated by the control circuit 140. Each bit of the digital signals DN0 to DN7 is input from the control circuit 140 to the inverters Q0N to Q7N. Furthermore, output units of the inverters Q0N to Q7N are connected to the second electrodes of the binary capacitances C0N to C7N.

Inverters QN0 to QN7 invert the digital signals DN0 to DN7 input from the control circuit 140 to generate the reference signals D0N to D7N. A plurality of binary capacitances C0N to C7N included in the capacitance unit 121N subtract the reference signals D0N to D7N from the analog signal VAN by extracting charges based on the reference signals D0N to D7N from charges based on the analog signal VAN held in the attenuation capacitance CHN through charge redistribution. The capacitance unit 121N outputs the analog signal VCN serving as the subtraction result.

Figure 3:
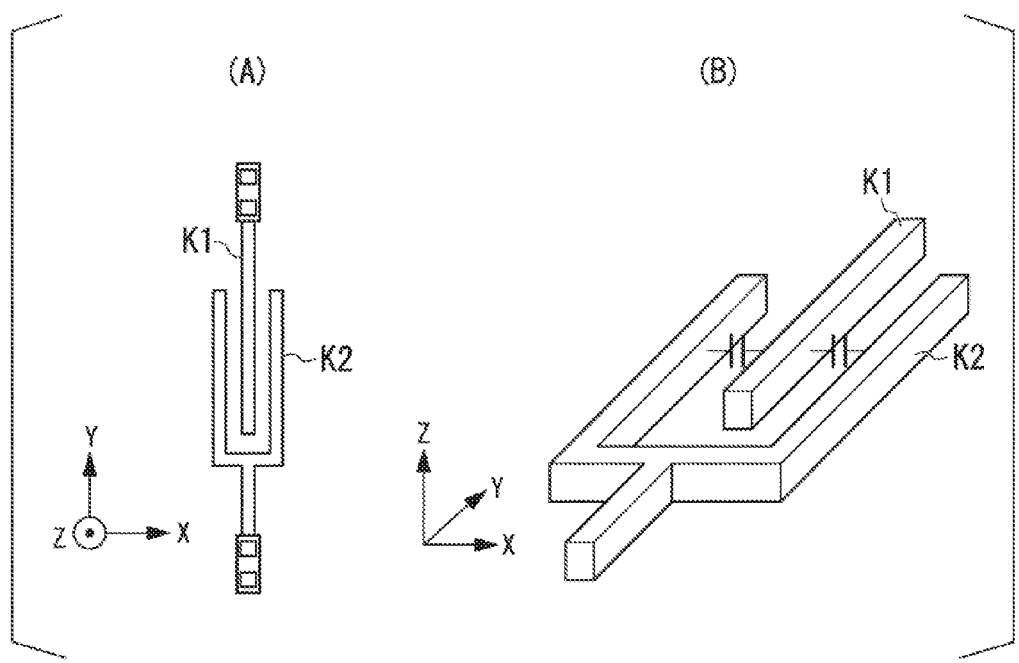
FIG. 3 is a diagram showing an example of a unit capacitance constituting a capacitance circuit included in the successive approximation type A/D converter according to the first embodiment of the present invention, (A) of FIG. 3 is a pattern layout diagram of the unit capacitance, and (B) of FIG. 3 is a perspective view of the unit capacitance.

FIG. 3 is a diagram showing an example of a unit capacitance constituting each capacitance of the capacitance circuit 121 included in the successive approximation type A/D converter 100 according to the first embodiment of the present invention. Here, (A) of FIG. 3 is a pattern layout diagram of the unit capacitance and (B) of FIG. 3 is a perspective view of the unit capacitance.

A fixed capacitance Ch1 (a fixed capacitance unit), a variable capacitance Ch2 (Ch21 to Ch24) (a variable capacitance unit), and the binary capacitances C0P to C7P and C0N to C7N, which will be described below, included in the capacitance circuit 121 are constituted by integrating the unit capacitances having the same shape and structure.

As shown in (A) and (B) of FIG. 3, unit capacitances constituting capacitances of the capacitance circuit 121 are realized by inter-wiring capacitances formed in a horizontal direction in the same wiring layer and referred to as a metal-oxide-metal (MOM) capacitance. In the example shown in (A) and (B) of FIG. 3, the unit capacitances are realized by inter-wiring capacitances formed between a metal wiring K1 and a metal wiring K2 formed above a semiconductor substrate (not shown) at predetermined intervals. In the example in (A) and (B) of FIG. 3, each of the unit capacitances is a capacitance between comb-shaped electrodes constituted of the metal wiring K1 and the metal wiring K2. Capacitances of the capacitance circuit 121 are formed by connecting the unit capacitances in parallel by the number according to the capacitance value thereof.

Here, MOM capacitances, unlike metal-insulator-metal (MIM) capacitances having a stacked structure in a vertical direction, can be formed as small capacitances through miniaturization of a semiconductor process. For example, the MOM capacitances of 0.5 tF as a capacitance value of the unit capacitance can be realized. Since electric power (charge and discharge electric power) consumed by the capacitance circuit 121 is proportional to the capacitance values of the binary capacitances C0P to C7P and C0N to C7N, the electric power consumed in the capacitance circuit 121 can be minimized by setting small values to the capacitance values of the binary capacitances C0P to C7P and C0N to C7N.

Figure 4:
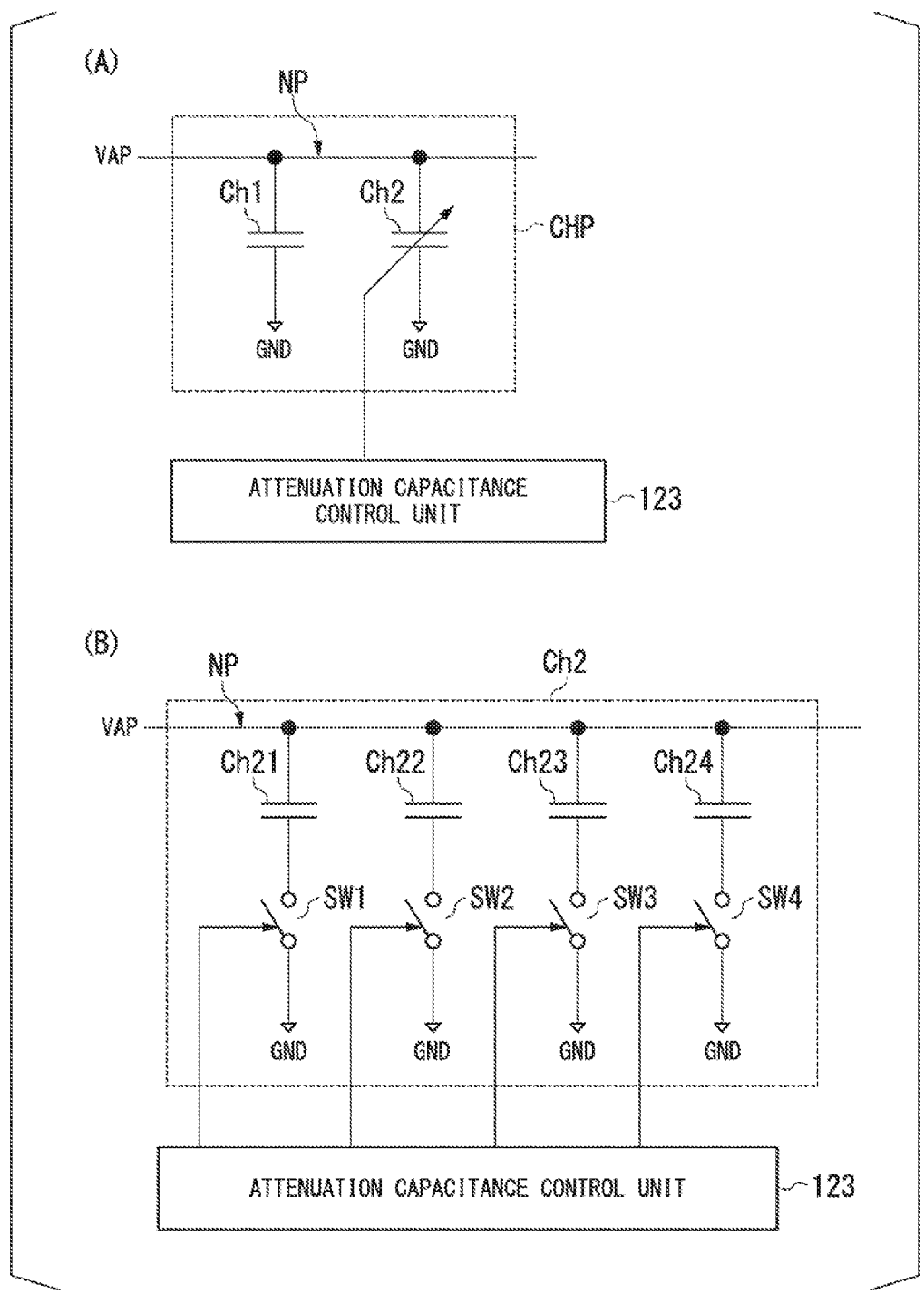
FIG. 4 is a diagram showing an example of a constitution of an attenuation capacitance included in the successive approximation type A/D converter according to the first embodiment of the present invention. (A) of FIG. 4 is a schematic view, and (B) of FIG. 4 is a detail view.

FIG. 4 is a diagram showing an example of a constitution of the attenuation capacitance CHP included in the successive approximation type A/D converter 100 according to the first embodiment of the present invention. Here, (A) of FIG. 4 is a schematic view of the attenuation capacitance CHP and (B) of FIG. 4 is a detail view of the attenuation capacitance CHP. The attenuation capacitance CHN is also the same as the attenuation capacitance CHP, and a description thereof will be omitted here.

As shown in (A) of FIG. 4, the attenuation capacitance CHP includes the fixed capacitance Ch1 and the variable capacitance Ch2. A first electrode of the fixed capacitance Ch1 is connected to the signal node NP and a second electrode of the fixed capacitance Ch1 is connected to the around GND (a predetermined potential node). Furthermore, a first electrode of the variable capacitance Ch2 is connected to the signal node NP and a second electrode of the variable capacitance Ch2 is connected to the ground GND. In other words, the fixed capacitance Ch1 and the variable capacitance Ch2 are connected in parallel between the signal node NP and the ground GND.

As shown in (B) of FIG. 4, the variable capacitance Ch2 includes capacitances Ch21, Ch22, Ch23, and Ch24 and switches SW1, SW2, SW3, and SW4. Here, the capacitance Ch21 is connected in series with the switch SW1 between the signal node NP and the ground GND. To be specific, a first electrode of the capacitance Ch21 is connected to the signal node NP and a second electrode of the capacitance Ch21 is connected to a first terminal of the switch SW1. A second terminal of the switch SW1 is connected to the ground GND.

Similarly, the capacitance Ch22 is connected in series with the switch SW2 between the signal node NP and the ground GND. The capacitance Ch23 is connected in series with the switch SW3 between the signal node NP and the ground GND. The capacitance Ch24 is connected in series with the switch SW4 between the signal node NP and the ground GND.

Note that any serial connection relationship among the capacitances Ch21 to Ch24 and the switches SW1 to SW4 can be adopted and positions of the capacitances Ch21 to Ch24 and the switches SW1 to SW4 may be exchanged.

Switching on and off of the switches SW1, SW2, SW3, and SW4 are individually controlled by the attenuation capacitance control unit 123. A capacitance value of the variable capacitance Ch2 is decided in accordance with a combination of on and off states of the switches SW1, SW2, SW3, and SW4. As shown in (A) of FIG. 4, since the variable capacitance Ch2 is connected in parallel with the fixed capacitance Ch1, the on and off states of the switches SW1, SW2, SW3, and SW4 is controlled so that the combined capacitance value of the attenuation capacitance CHP constituted of the fixed capacitance Ch1 and the variable capacitance Ch2 can be adjusted. The details of adjustment of the combined capacitance of the attenuation capacitance CHP will be described below.

Figure 5:
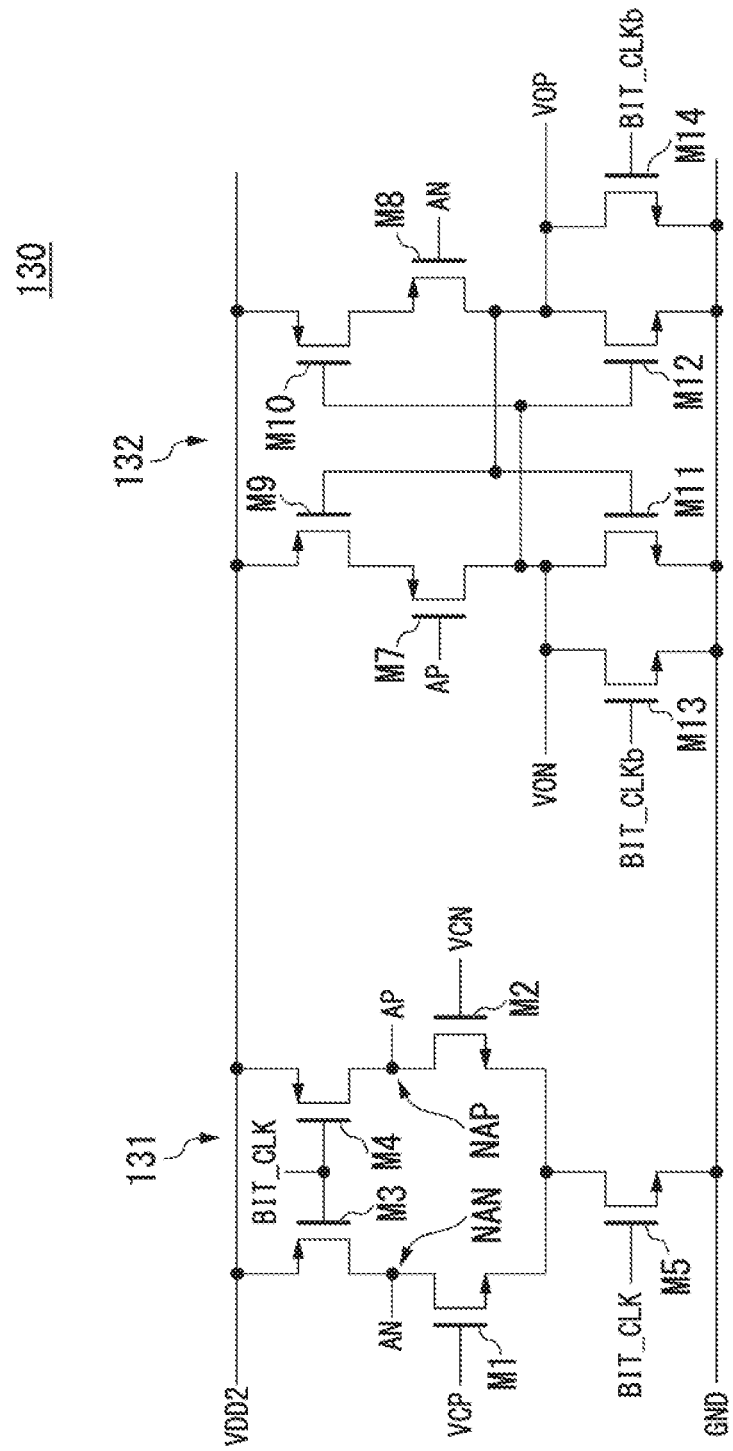
FIG. 5 is a circuit diagram showing an example of a constitution of a comparison circuit included in the successive approximation type A/D converter according to the first embodiment of the present invention.

FIG. 5 is a circuit diagram showing an example of a constitution of the comparison circuit 130.

As shown in the comparison circuit 130 includes a differential amplifier circuit 131 and a latch circuit 132. The differential amplifier circuit 131 includes a transistor M1, a transistor M2, a transistor M3, a transistor M4, a transistor M5, and a transistor M6. The transistor M1, the transistor M2, the transistor M5, and the transistor M6 are N-channel type field effect transistors. Furthermore, the transistor M3 and the transistor M4 are P-channel type field effect transistors. Note that types of transistors constituting the differential amplifier circuit 131 can be arbitrarily selected as long as an amplification function of the differential amplifier circuit 131 can be obtained.

A gate terminal of the transistor M1 is connected to a first input terminal. A gate terminal of the transistor M2 is connected to a second input terminal. The first input terminal and the second input terminal are differential input terminals to which the analog signal VAP and the analog signal VAN serving as differential input signals are input. The analog signal VCP is input from the capacitive DAC circuit 120 to the gate terminal of the transistor M1 via the first input terminal. Furthermore, the analog signal VCN is input from the capacitive DAC circuit 120 to the gate terminal of the transistor M2 via the second input terminal.

A source terminal of the transistor M3 is connected to a second power supply voltage VDD2. A drain terminal of the transistor M3 is connected to a drain terminal of the transistor M1. A source terminal of the transistor M4 is connected to the second power supply voltage VDD2. A drain terminal of the transistor M4 is connected to a drain terminal of the transistor M2. A gate terminal of the transistor M4 is connected to a gate terminal of the transistor M3. The internal clock signal BIT_CLK is input to the gate terminal of the transistor M3 and the gate terminal of the transistor M4. Note that the second power supply voltage VDD2 is preferably set to the voltage of the first power supply voltage VDD1 or more supplied to the drive units 122P and 122N included in the capacitive DAC circuit 120 due to the restriction of an input voltage range of the comparison circuit 130 (VDD2≥VDD1).

A source terminal of the transistor M5 is connected to the ground GND configured to provide a minimum voltage. A drain terminal of the transistor M5 is connected to a source terminal of the transistor M1 and a source terminal of the transistor M2. The internal clock signal BIT_CLK is input to a gate terminal of the transistor M5.

The latch circuit 132 includes a transistor M7, a transistor M8, a transistor M9, the transistor M10, the transistor M11, the transistor M12, the transistor M13, and the transistor M14. The transistor M11, the transistor M12, the transistor M13, and the transistor M14 are N-channel field effect transistors. The transistor M7, the transistor M8, the transistor M9, and the transistor M10 are P-channel type field effect transistors. Note that types of transistors constituting the latch circuit 132 can be arbitrarily selected as long as a latch function of the latch circuit 132 can be obtained.

A gate terminal of the transistor M7 is connected to the drain terminal of the transistor M2. An analog signal AP output from the differential amplifier circuit 131 is input to the gate terminal of the transistor M7. A gate terminal of the transistor M8 is connected to the drain terminal of the transistor M1. An analog signal AN output from the differential amplifier circuit 131 is input to the gate terminal of the transistor M8.

A source terminal of the transistor M9 is connected to the second power supply voltage VDD2. A drain terminal of the transistor M9 is connected to a source terminal of the transistor M7. A source terminal of the transistor M10 is connected to the second power supply voltage VDD2. A drain terminal of the transistor M10 is connected to a source terminal of the transistor M8.

A source terminal of the transistor M11 is connected to the ground GND configured to provide the minimum voltage. A drain terminal of the transistor M11 is connected to a drain terminal of the transistor M7. A gate terminal of the transistor M11 is connected to a gate terminal of the transistor M9 and a drain terminal of the transistor M8. A source terminal of the transistor M12 is connected to the around GND configured to provide the minimum voltage. A drain terminal of the transistor M12 is connected to the drain terminal of the transistor M8. A gate terminal of the transistor M12 is connected to a gate terminal of the transistor M10 and the drain terminal of the transistor M7.

A source terminal of the transistor M13 is connected to the around GND configured to provide the minimum voltage. A drain terminal of the transistor M13 is connected to the drain terminal of the transistor M11. The inverted internal clock signal BIT_CLKb obtained by inverting the internal dock signal BIT_CLK is input to a gate terminal of the transistor M13. A source terminal of the transistor M14 is connected to the ground GND configured to provide the minimum voltage. A drain terminal of the transistor M14 is connected to the drain terminal of the transistor M12. The inverted internal clock signal BIT_CLKb is input to a gate terminal of the transistor M14.

The drain terminal of the transistor M14 is connected to a first output terminal. Furthermore, the drain terminal of the transistor M13 is connected to a second output terminal. The first output terminal and the second output terminal are terminals configured to output a digital signal VOP and a digital signal VON indicating comparison results of a voltage of the analog signal AP and a voltage of the analog signal AN. The digital signal VOP is output from the first output terminal. Furthermore, the digital signal VON is output from the second output terminal.

Next, a basic operation of the comparison circuit 130 will be described.

First, a case in which the internal clock signal BIT_CLK is at a Low level will be described.

Since the inverted internal clock signal BIT_CLKb is at a High level when the internal clock signal BIT_CLK is at the Low level, the transistor M5 of the differential amplifier circuit 131 is turned off and the transistor M3 and the transistor M4 are turned on. Furthermore, the transistor M13 and the transistor M14 of the latch circuit 132 are turned on.

In this case, the transistor M7 and the transistor M8, in which both of the analog signal AN and the analog signal AP are raised to the second power supply voltage VDD2 and the analog signal AN and the analog signal AP are input to the gates thereof, are turned off. On the other hand, the transistor M13 and the transistor M14 are turned on and both of the digital signal VOP and the digital signal VON are lowered to the ground GND through the transistor M13 and the transistor M14.

Next, a case in which the internal clock signal BIT_CLK is switched from a Low level to a High level while the analog signal VCP is larger than the analog signal VCN (VCP>VCN) will be described.

When the internal clock signal BIT_CLK is switched from the Low level to the High level, the transistor M5 is turned on and a drain current flows through the transistor M5 in the differential amplifier circuit 131. Furthermore, the transistor M3 and the transistor M4 are turned off and the transistor M1 and the transistor M2 extract charges from parasitic capacitances (not shown) coupled to a node NAN of the drain terminal of the transistor M1 and a node NAP of the drain terminal of the transistor M2.

In a process in which the transistor M1 and the transistor M2 extract the charges from the parasitic capacitances, a difference occurs in speed of extracting the charges from the parasitic capacitances coupled to the node NAN of the drain terminal of the transistor M1 and the signal node NP of the drain terminal of the transistor M2 due to a difference between potentials of the analog signal VCP and the analog signal VCN. Here, since the analog signal VCP is larger than the analog signal VCN (VCP>VCN), a current flowing through the transistor M1 is larger than a current flowing through the transistor M2 and the potential of the analog signal AN falls faster than the potential of the analog signal AP. For this reason, the potential of the analog signal AN becomes low relatively faster than the potential of the analog signal AP.

Also, in the latch circuit 132, when the internal clock signal BIT_CLK changes from a Low level to a High level and the inverted internal clock signal BIT_CLKb changes from a High level to a Low level, potentials of the digital signal VOP and the digital signal VON both increase toward the second power supply voltage VDD2. In this case, since a potential of an analog signal AN becomes low faster than a potential of an analog signal AP, the transistor M8 is turned on faster than the transistor M7. For this reason, the rising speed of the potential of the digital signal VOP is faster than that of the potential of the digital signal VON and thus the potential of the digital signal VOP is raised toward the second power supply voltage VDD2.

In this case, since an inverter formed by the transistors M7, M9, and M11 and an inverter formed by the transistors M8, M10, and M12 are cross-coupled, the transistor M9 to which the digital signal VOP is applied is turned off. For this reason, the digital signal VON is lowered toward the ground GND. Therefore, the digital signals VOP and VON having a potential relationship according to a magnitude relation between the analog signal VCP and the analog signal VCN are output from the comparison circuit 130.

To be specific, when the analog signal VCP is larger than the analog signal VCN (VCP>VCN), the potential of the digital signal VOP becomes a potential of the second power supply voltage VDD2 and the potential of the digital signal VON becomes a potential of the ground GND. On the contrary, when the analog signal VCN is larger than the analog signal VCP (VCN>VCP), the potential of the digital signal VON becomes the potential of the second power supply voltage VDD2 and the potential of the digital signal VOP becomes the potential of the ground GND. As described above, the comparison circuit 130 outputs binary digital signals VOP and VON indicating a magnitude relation between the analog signal VCP and the analog signal VCN.

The comparison circuit 130 is a dynamic type comparator. In the dynamic comparison circuit 130, only a through current at a time of operating flows as an operating current like in a complementary metal oxide semiconductor (CMOS) logic. In other words, in the dynamic comparison circuit 130, a current transiently flows only when signal levels of the internal clock signal BIT_CLK and the inverted internal clock signal BIT_CLKb transition from a High level to a Low level or a Low level to a High level, and thus a steady current (an current) does not occur. For this reason, the dynamic comparison circuit 130 is suitable for low power consumption.

Next, an operation (A/D conversion) of the successive approximation type A/D converter 100 will be described with reference to a timing chart of FIG. 6.

When the clock signal CLK is at a Low level, the sampling circuit included in the successive approximation type A/D converter 100 tracks and samples the analog signal VAP and the analog signal VAN input as the differential input signal VA and holds the analog signal VAP and the analog signal VAN at a timing at which the clock signal CLK transitions from the Low level to a High level.

In the following description, since the analog signal VAP and the analog signal VAN are tracked and sampled in a period during which the clock signal CLK is at a Low level, a period during which the clock signal CLK is at the Low level is referred to as a sampling period. Furthermore, since the analog signal VAP and the analog signal VAN are held in a period during which the clock signal CLK is at a High level, a period during which the clock signal CLK is at the High level is referred to as a hold period.

As will be described below, the successive approximation type A/D converter 100 performs A/D conversion on the analog signals VAP and VAN, which are sampled by the sampling circuit 110 in the sampling period, in the hold period. In brief, the successive approximation type A/D converter 100 sequentially determines values of bits of the digital signals D0 to D7 from the most significant bit (D7) to the least significant bit (D0) in accordance with clock timings of the internal clock signal BIT_CLK and the inverted internal clock signal BIT_CLKb input from the control circuit 140 in the hold period. Thus, the successive approximation type A/D converter 100 performs A/D conversion on the analog signals VAP and VAN held by the sampling circuit 110 to generate the digital signals D0 to D7.

A/D conversion using the successive approximation type A/D converter 100 will be described in detail.

Figure 6:
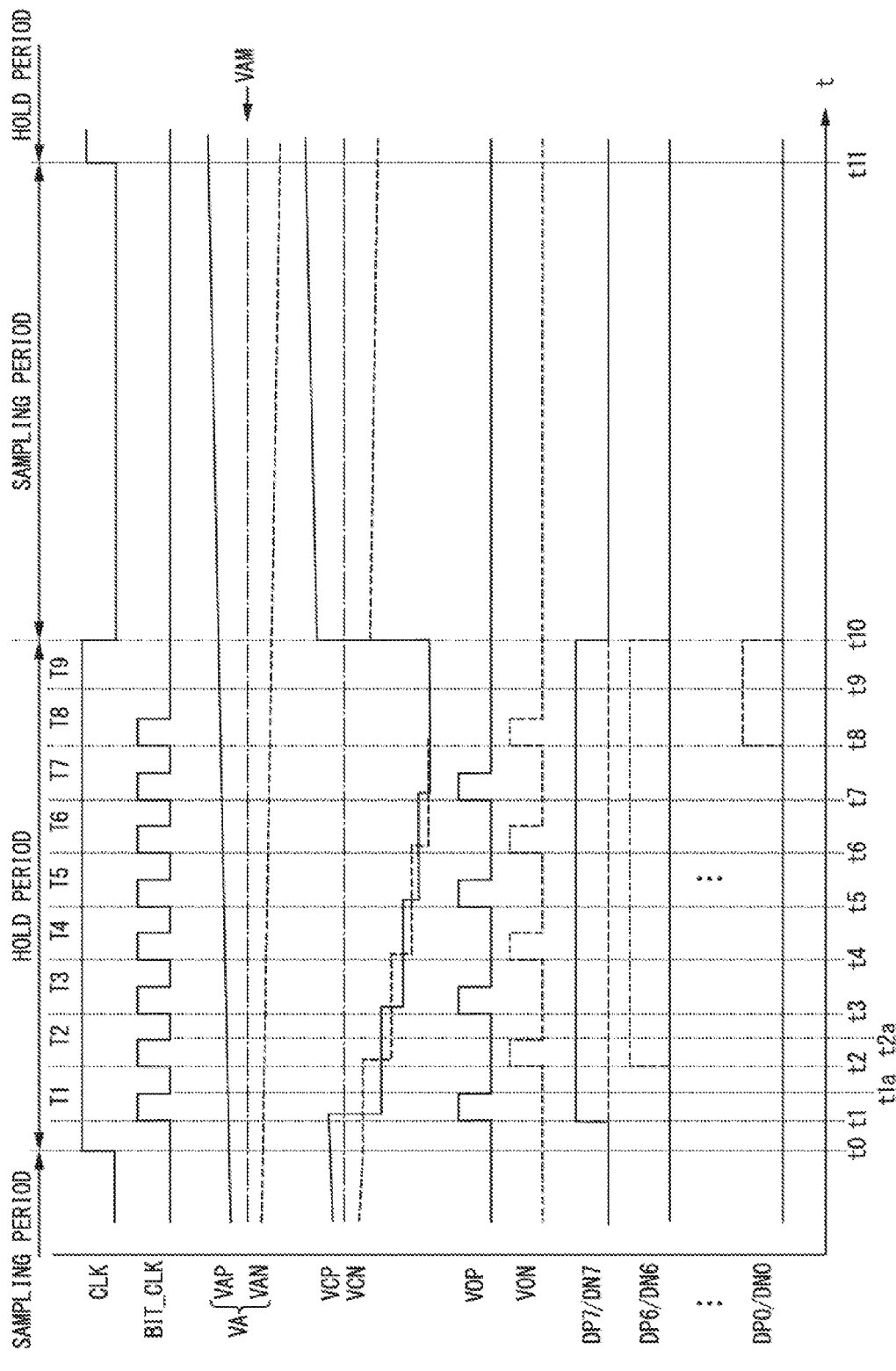
FIG. 6 is a timing chart showing an example of an operation of the successive approximation type A/D converter according to the first embodiment of the present invention.

The clock signal CLK is at a Low level in the sampling period before a time to in the timing chart of FIG. 6. For this reason, the switches 110P and 110N of the sampling circuit 110 are in an on state. In this case, the analog signals VAP and VAN are sampled (tracked) by the sampling circuit 110 and supplied to the capacitive DAC circuit 120. The attenuation capacitances CHP and CHN and the binary capacitances C0P to C7P and C0N to C7N of the capacitive DAC circuit 120 are charged with charges corresponding to the potentials of the analog signal VAP and the analog signal VAN supplied from the sampling circuit 110.

Note that, in the sampling period, the bits of the digital signals DP0 to DP7 and DN0 to DN7 output from the control circuit 140 are set (initialized) to "0".

At the time t0, when the clock signal CLK transitions from a Low level to a High level and the hold period starts, the switch 110P and the switch 110N of the sampling circuit 110 are switched off. For this reason, the analog signals VAP and VAN immediately before the clock signal CLK transitions from the Low level to the High level are held in the attenuation capacitances CHP and CHN and the binary capacitances C0P to C7P and C0N to C7N of the capacitance circuit 121 included in the capacitive DAC circuit 120. The held analog signals VAP and VAN are supplied from the capacitive DAC circuit 120 to the comparison circuit 130 as the analog signals VCP and VCN.

As will be described below, the comparison circuit 130 sequentially compares the analog signal VCP and the analog signal VCN supplied from the capacitive DAC circuit 120 under the control of the control circuit 140.

First, an operation in a period T1 from a time t1 to a time t2 corresponding to a first cycle of the internal clock signal BIT_CLK after the time t0 will be described.

When the internal clock signal BIT_CLK changes from a Low level to a High level at the time t1 in a state in Which the analog signals VAP and VAN are held in the sampling circuit 110 and output from the capacitive DAC circuit 120 as the analog signals VCP and VCN, the latch circuit 132 of the comparison circuit 130 becomes active and the comparison circuit 130 starts a comparison operation between the analog signal VCP and the analog signal VCN.

In the example of FIG. 6, since the signal level of the analog signal VCP is larger than the signal level of the analog signal VCN at the time t1 (VCP>VCN), the comparison circuit 130 outputs the digital signal VOP at a High level and the digital signal VON at a Low level as a comparison result. The control circuit 140 receives the comparison result of the comparison circuit 130 and outputs a digital signal DP7 at a High level and a digital signal DN7 at a Low level. Thus, the value of the most significant bit (D7), among the bits of the digital signals D0 to D7 obtained by the A/D conversion, which is provided through the digital signals DP7 and DN7 is determined.

Here, when the digital signal DP7 changes from a Low level to a High level, an output signal (the reference signal) of the inverter Q7P of the drive unit 122P (FIG. 2), to which the digital signal DP7 is input, transitions from a High level to a Low level and a voltage between electrodes of the binary capacitance C7P, to which the output signal of the inverter Q7P is applied, changes. For this reason, charges accumulated in the binary capacitance C7P are extracted and charge redistribution is performed in accordance with the amount of change of a voltage between the electrodes of the binary capacitance C7P. As a result, the potential of the signal node NP (FIG. 2) inside the capacitive DAC circuit 120 to which the attenuation capacitance CHP and the binary capacitances C0P to C7P are commonly connected falls to a potential corresponding to the charges extracted from the binary capacitance C7P through the charge redistribution. For this reason, the signal level of the analog signal VCP given by the potential of the signal node NP falls.

On the other hand, since the digital signal DN7 is maintained at the Low level, the output signal (the reference signal) of the inverter Q7N of the drive unit 122N, to which the digital signal DN7 is input, is maintained at the High level. For this reason, since there is no charge transfer in the binary capacitance C7N to which the output signal of the inverter Q7N is applied, the potential of the signal node NN (FIG. 2) inside the capacitive DAC circuit 120, to which the attenuation capacitance CHN and the binary capacitances C0N to C7N are commonly connected, does not change. For this reason, the signal level of the analog signal VCN given by the potential of the signal node NN does not change.

When the internal clock signal BIT_CLK changes to a Low level and the inverted internal clock signal BIT_CLKb changes to a High level at a time t1a, the latch circuit 132 of the comparison circuit 130 becomes inactive. In this case, the comparison circuit 130 outputs a Low level as the digital signals VOP and VON.

Next, the operation in a period T2 from the time t2 to a time t3 corresponding to a second cycle of the internal clock signal BIT_CLK will be described.

When the internal clock signal BIT_CLK changes from a Low level to a High level at the time t2 and the inverted internal clock signal BIT_CLKb changes from a High level to a Low level in a state in which the analog signals VAP and VAN are held in the sampling circuit 110 and output from the capacitive DAC circuit 120 as the analog signals VCP and VCN, the latch circuit 132 of the comparison circuit 130 becomes active and the comparison circuit 130 starts the comparison operation between the analog signal VCP and the analog signal VCN supplied from the capacitive DAC circuit 120.

In the example of FIG. 6, since the signal level of the analog signal VCP is smaller than the signal level of the analog signal VCN at the time t2 (VCP<VCN), the comparison circuit 130 outputs the digital signal VOP at a Low level and the digital signal VON at a High level as the comparison result. The control circuit 140 receives the comparison result of the comparison circuit 130 and outputs a digital signal DP6 at a Low level and a digital signal DN6 at a High level. Thus, the value of a second bit from the most significant bit (D6), among the bits of the digital signals D0 to D7 obtained by the A/D conversion, which is provided through the digital signals DP6 and DN6 is determined.

Here, since the digital signal DP6 is maintained at the Low level, the output signal (the reference signal) of the inverter Q6P of the drive unit 122P, to which the digital signal DP6 is input, is maintained at the High level. For this reason, since there is no charge transfer in the binary capacitance C6P to which the output signal of the inverter Q6P is applied, the potential of the signal node NP (FIG. 2) inside the capacitive DAC circuit 120, to which the attenuation capacitance CHP and the binary capacitances C0P to C7P are commonly connected, does not change. For this reason, the signal level of the analog signal VCP given by the potential of the signal node NP does not change.

On the other hand, when the digital signal DN6 changes from a Low level to a High level, an output signal (the reference signal) of the inverter Q6N of the drive unit 122N (FIG. 2), to which the digital signal DN6 is input, transitions from a High level to a Low level and a voltage between electrodes of the binary capacitance C6N, to which the output signal of the inverter Q6N is applied, changes. For this reason, charges accumulated in the binary capacitance C6N are extracted and charge redistribution is performed in accordance with the amount of change of the voltage between the electrodes of the binary capacitance C6N. As a result, a potential of the signal node NN (FIG. 2) inside the capacitive DAC circuit 120, to which the attenuation capacitance CHN and the binary capacitances C0N to C7N are commonly connected, falls to a potential corresponding to the charges extracted from the binary capacitance C6N through the charge redistribution. For this reason, the signal level of the analog signal VCN given by the potential of the signal node NN falls.

Subsequently, when the internal clock signal BIT_CLK changes to a Low level and the inverted internal clock signal BIT_CLKb changes to a High level at a time t2a, the latch circuit 132 of the comparison circuit 130 becomes inactive. Thus, the comparison circuit 130 outputs a Low level as the digital signals VOP and VON.

Subsequently, in periods T3 to T8 after the time t3, comparison operations similar to the comparison operations in the periods T1 and T2 are sequentially repeated (that is, successive comparison is performed), and thus each value of the third bit (D5) to the least significant bit (D0) of the digital signals D0 to D7 is determined. Thus, the digital signals D0 to D7 in which values of all bits are determined by A/D conversion are obtained.

Subsequently, in a period T9, the control circuit 140 of the successive approximation type A/D converter 100 outputs the digital signals D0 to D7 which are finally obtained by the A/D conversion through an output terminal.

Subsequently, when the clock signal CLK transitions from a High level to a Low level at a time t10, the switch 110P and the switch 110N of the sampling circuit 110 are switched on. Thus, in the sampling period from the time t10 to a time t11 in which the clock signal CLK is maintained at the Low level, the analog signal VAP and the analog signal VAN are newly sampled (tracked) by the sampling circuit 110.

Also, the attenuation capacitances CHP and CHN and the binary capacitances C0P to C7P and C0N to C7N of the capacitive DAC circuit 120 are charged with charges corresponding to the newly sampled analog signals VAP and VAN. Furthermore, in the control circuit 140, the bits of the digital signals DP0 to DP7 and DN0 to DN7 are set (initialized) to "0." After that A/D conversion using successive comparison is performed in the hold period after the time t11 like in the A/D conversion in the hold period from the time t1 to the time t10 shown in FIG. 6.

Next, a method of securing a full scale range of digital signals VP0 to VP7 serving as characteristics of the embodiment will be described in detail.

Here, in order to facilitate understanding, it is assumed that the first power supply voltage VDD1=the second power supply voltage VDD2=a power supply voltage VDD is satisfied.

In the embodiment, the full scale range of the digital signals VP0 to VP7 obtained by the A/D conversion can be adjusted by the attenuation capacitances CHP and CNN as will be described below.

In order to facilitate understanding, first, a relationship between the attenuation capacitances CHP and CNN, and the digital signals VP0 to VP7 and VN0 to VN7 shown in FIGS. 2 to 4 will be described and then a method of securing the full scale ranges will be described.

Here, although a description has been provided focusing on the attenuation capacitance CHP and the binary capacitances C0P to C7P constituting the capacitance unit 121P, the same applies to a description focusing on the attenuation capacitance CHN and the binary capacitances C0N to C7N constituting the capacitance unit 121N.

The capacitance values of the binary capacitances C0P to C7P of the capacitance unit 121P shown in FIG. 2 are weighted by binary numbers. In other words, when it is assumed that a capacitance value of each of the unit capacitances shown in FIG. 3 is Cu, the capacitance values of the binary capacitances C0P to C7P are represented as shown in the following Expression (1).

$C0P = 2^0 Cu = Cu$ $C1P = 2^1 Cu = 2Cu$ $C2P = 2^2 Cu = 4Cu$

. . .

$$C7P = 2^7 Cu = 128 Cu \quad (1)$$

Here, when it is assumed that the total amount of the binary capacitances C0P to C7P is Cdac, the total amount Cdac is represented by the following Expression (2). In the following Expression (2), Ci (I=0, 1, ..., 7), is capacitance values of the binary capacitances C0P to C7P.

[Math. 2]

$$Cdac = \sum_{i=0}^{7} Ci \quad (2)$$

A differential input dynamic range Vfs,pp of the successive approximation type A/D converter 100 is provided by the following Expression (3) in an ideal situation in which there is no parasitic capacitance or the like. In the following Expression (3), Ch is a capacitance value of the attenuation capacitance CHP, VDD is a power supply voltage of the drive circuit 122 configured to provide the amplitude of the reference signal, and k is a coefficient.

[Math. 3]

$$V_{fs,pp} = 2 \frac{Cdac}{Cdac + Ch} VDD = kVDD \quad (3)$$

Here, when the capacitance value Ch of the attenuation capacitance CHP is set so that the capacitance value Ch of the attenuation capacitance CHP is equal to the total amount Cdac of the binary capacitances C0P to C7P, the following Expression (4) is obtained. When the following Expression (4) is established, that is, when the coefficient k is 1 and the attenuation capacitance CHP is equal to the total amount Cdac of the binary capacitances C0P to C7P, the dynamic range for the differential input signal becomes a full scale range corresponding to the power supply voltage VDD of the drive circuit 122.

[Math. 4]

$$V_{fs,pp} = VDD, \quad (4)$$
$$k = 2 \frac{Cdac}{Cdac + Ch} = 1$$

However, when the capacitances of the capacitance circuit 121 are formed using the inter-wiring capacitances above the semiconductor substrate, the parasitic capacitances are formed in addition to the attenuation capacitance CHP and the binary capacitances C0P to C7P. When the parasitic capacitances are considered, the differential input dynamic range Vfs,pp is represented by the following Expression (5).

[Math. 5]

$$V_{fs,pp} = 2 \frac{Cdac}{Cdac + Ch + Cst1 + Cst2} VDD \quad (5)$$

Here, Cst1 is a parasitic capacitance generated in a metal wiring and Cst2 is an input capacitance (for example, a gate capacitance of a metal oxide semiconductor (MOS) transistor) of the comparison circuit 130.

In Expression (5), when the capacitance value Ch of the attenuation capacitance CHP is equal to the total amount Cdac of the binary capacitances C0P to C7P (that is, Ch=Cdac), Expression (5) is transformed into the following Expression (6).

[Math. 6]

$$V_{fs,pp} = 2 \frac{Cdac}{2Cdac + Cst1 + Cst2} VDD, \quad (6)$$
$$k = 2 \frac{Cdac}{2Cdac + Cst1 + Cst2} < 1$$

As understood from Expression (6), when there is a parasitic capacitance, a coefficient k is smaller than 1, a full scale range given by the power supply voltage VDD cannot be secured as the differential input dynamic range Vfs,pp, and an error occurs in an output value of A/D conversion. Thus, in the first embodiment, a part of the attenuation capacitance CHP of the capacitance circuit 121 is set to be variable and the attenuation capacitance CHP is constituted of the fixed capacitance Ch1 and the variable capacitance Ch2 so that the capacitance value Ch of the attenuation capacitance CHP can be adjusted such that the capacitance value Ch of the attenuation capacitance CHP substantially coincides with the total amount Cdac of the binary capacitances C0P to C7P even when there are the parasitic capacitances Cst1 and Cst2.

To be specific, as shown in FIG. 4, the attenuation capacitance CHP is constituted of the fixed capacitance Ch1 having a fixed capacitance value and the variable capacitance Ch2 having a variable capacitance value. The second electrode of the fixed capacitance Ch1 is directly connected to the ground GND, whereas the second electrode of the variable capacitance Ch2 is connected to the ground GND via a switch. Furthermore, the capacitance value of the variable capacitance Ch2 is weighted by a binary number and the weighting by the binary number is realized by adjusting the number of unit capacitances.

Here, the total amount of the variable capacitance Ch2 is represented by the following Expression (7). In the following Expression (7), Ch2j (i=1, ..., j) indicates capacitances Ch21, Ch22, Ch23, and Ch24 constituting the variable capacitance Ch2 shown in (B) of FIG. 4. In the example of (B) of FIG. 4, j is 4.

[Math. 7]

$$Ch2 = \sum_{i=0}^{j} Ch2j \quad (7)$$

At a design stage, the total amount of the variable capacitance Ch2 is set to be larger than a maximum value of the amount of variation of a parasitic capacitance which changes according to a process variation. To be specific, the fixed capacitance Ch1 and the variable capacitance Ch2 are set so that the total amount Cdac of the fixed capacitance Ch1 and the variable capacitance Ch2 satisfies a relationship in which Ch1<Cdac and Cdac+Cst1+Cst2<Ch1+Ch2 are satisfied.

When the attenuation capacitance CHP is adjusted, the capacitance value of the variable capacitance Ch2 is adjusted by switching on and off states of switches SW1 to S4 so that a condition that Vfs,pp=VDD (k=1) is satisfied.

Next, an adjustment principle of a capacitance value of the variable capacitance Ch2 will be described with reference to a characteristic diagram of FIG. 7.

Figure 7:
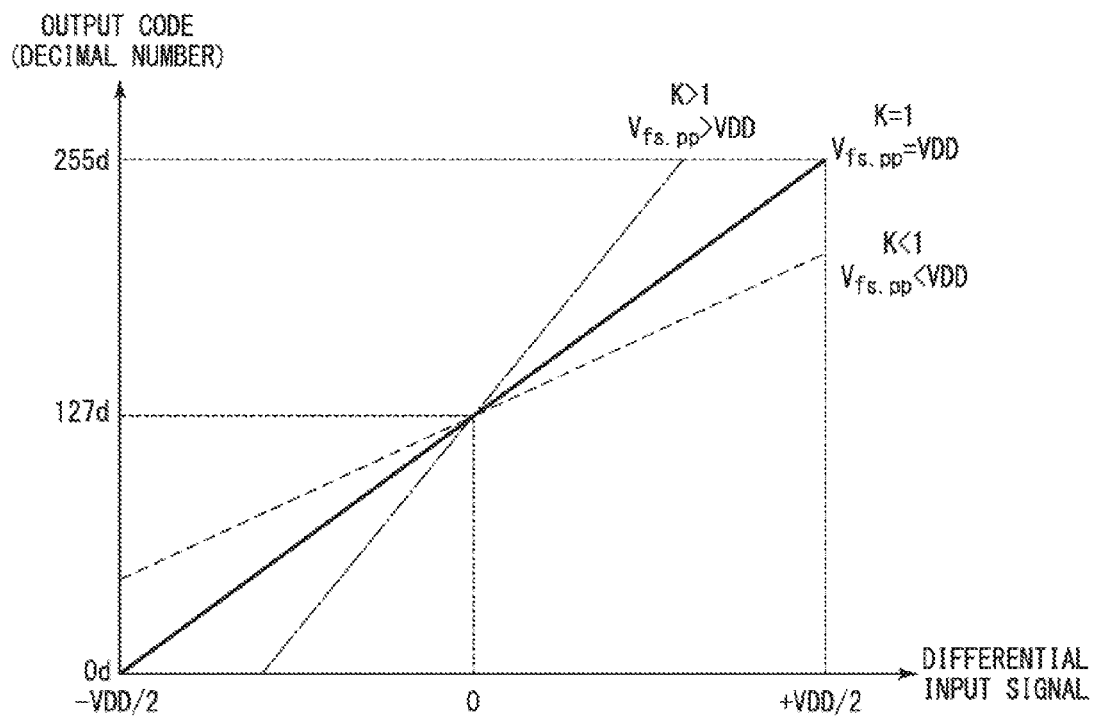
FIG. 7 is a diagram showing an adjustment principle of a capacitance value of a variable capacitance constituting the attenuation capacitance of the successive approximation type A/D converter according to the first embodiment of the present invention.

FIG. 7 is a diagram showing the adjustment principle of the capacitance value of the variable capacitance Ch2 constituting the attenuation capacitance CHP of the successive approximation type A/D converter 100 according to the first embodiment of the present invention and is a diagram showing an input and output characteristic of the successive approximation type A/D converter 100.

The successive approximation type A/D converter 100 is a fully differential type device. A phase of an alternating current (AC) component of the analog signal VAP and a phase of an AC component of the analog signal VAN constituting the differential input signal VA input to the inverting input terminal INN and the non-inverting input terminal INP have a mutually reversed phase relationship and have a relationship in which the phases are shifted by 180 degrees. For this reason, each of the analog signals VAP and VAN when the differential input signal VA is 0 V, that is, when the differential voltage between the analog signal VAP and the analog signal VAN is 0 V, becomes a reference point (a central point) of an input voltage in an A/D conversion operation.

Therefore, when an 8-bit successive approximation type A/D converter 100 performs an ideal operation, that is, when a capacitance value of the attenuation capacitance CHP is correctly adjusted (k=1), the input and output characteristic of the successive approximation type A/D converter 100 is represented by a straight line passing through coordinates (−VDD/2,0), coordinates (0 V, 127d), and coordinates (+VDD/2,255d) exemplified as a solid line in FIG. 7. In this case, a full scale range is obtained. This means that a full scale output code (0d to 255d) is obtained with respect to the entire range (−VDD/2 to +VDD/2) of the differential input signal VA (the analog signal VCP) as a digital signal obtained through A/D conversion.

Therefore, in the case of an ideal characteristic (k=1) exemplified as the solid line in FIG. 7, the following relationship is established between the differential input signal VA and an output code (a converted digital signal).

(1) When the differential input signal VA is 0 V, the output code is 127d (an intermediate value).

(2) When the differential input signal VA is −VDD/2 V, the output code is 0d.

(3) When the differential input signal VA is +VDD/2 V, the output code is 255d.

On the other hand, when the capacitance value of the attenuation capacitance CHP is not correctly adjusted (when k is not 1), a slope of the straight line indicating the input and output characteristic of the successive approximation type A/D converter 100 varies around coordinates (0 V, 127d) corresponding to the reference point and serving as an axis. In the example of FIG. 7, when k is larger than 1 (k>1) as indicated by an alternating single-dot-dash line, the slope of the straight line indicating the input and output characteristic of the success e approximation type A/D converter 100 tends to increase as compared to when k is 1 (k=1). On the contrary, when k is smaller than 1 (k<1), the slope of the straight line indicating the input and output characteristic of the successive approximation type A/D converter 100 tends to decrease as compared to when k is 1 (k=1) as indicated by a broken line.

When the above-described characteristic is used, the capacitance value of the variable capacitance Ch2 of the attenuation capacitance CHP can be adjusted so that k is 1 (k=1) and thus the variable capacitance Ch2 can be correctly adjusted. That is realized by inputting analog signals VAP and VAN of a known voltage other than 0 V, which are used to provide a reference point, to the successive approximation type A/D converter 100 as a differential input signal VA and referring to a magnitude relation between a value of an output code obtained in this case and a target code represented by the characteristic indicated by the solid line in FIG. 7.

Next, a procedure of adjusting a capacitance value of the variable capacitance Ch2 based on the adjustment principle will be described with reference to a flowchart of FIG. 8.

Figure 8:
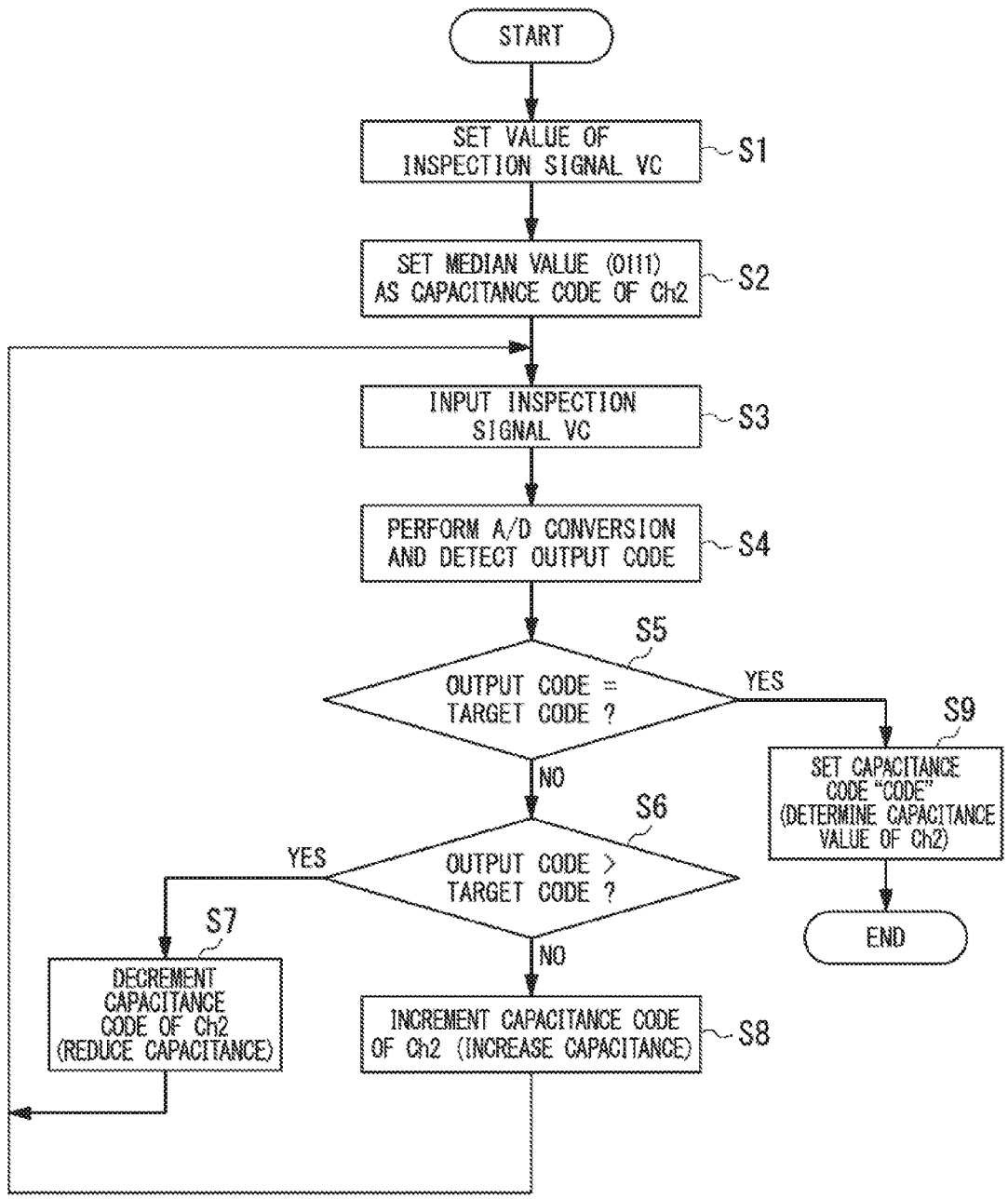
FIG. 8 is a flowchart showing an example of an operation of the successive approximation type A/D converter according to the first embodiment of the present invention.

FIG. 8 is a flowchart showing an example of an operation of the successive approximation type A/D converter 100 according to the first embodiment of the present invention and is a diagram showing the procedure of adjusting the capacitance value of the variable capacitance Ch2 constituting the attenuation capacitance CHP.

Control associated with the procedure of adjusting the capacitance value of the variable capacitance Ch2 is mainly performed by the attenuation capacitance control unit 123.

The attenuation capacitance control unit 123 starts the procedure of adjusting the capacitance value of the variable capacitance Ch2 after the successive approximation type A/D converter 100 is activated.

In this case, an operator (for example, a user, a person in charge of manufacturing, or the like of the successive approximation type A/D converter 100) sets a voltage other than 0 V corresponding to a reference point as a value of an inspection signal VC, namely the differential input signal VA input to the successive approximation type A/D converter 100 (Step S1). For example, the operator sets a differential voltage of "−VDD/4" as the inspection signal VC.

Subsequently, for example, the operator sets a capacitance code "0111b" (a median value) corresponding to ½ of the total amount of the variable capacitance Ch2 for the attenuation capacitance control unit 123 as the capacitance value of the variable capacitance Ch2 (Step S2). The attenuation capacitance control unit 123 controls on and off states of the switches SW1 to S4 on the basis of the capacitance code "0111b" so that the combined capacitance of the fixed capacitance Ch1 and the variable capacitance Ch2 is near a median value of a variable range of the attenuation capacitance CHP. Here, the capacitance code is not limited to "0111b" (the median value) and can be arbitrarily set.

Subsequently, the operator inputs the differential voltage of "−VDD/4" to the successive approximation type A/D converter 100 as the inspection signal VC (Step S3). The successive approximation type A/D converter 100 samples the inspection signal (a pseudo signal) VC input as the differential input signal VA and performs A/D conversion on the inspection signal VC. In addition, the control circuit 140 of the successive approximation type A/D converter 100 detects an output code of a digital signal obtained by performing the A/D conversion on the inspection signal VC (Step S4). In this case, since the differential voltage of "−VDD/4" is input as the inspection signal VC, an expected output code of the digital signal is "63d" indicating an ideal median value.

The attenuation capacitance control unit 123 compares the detected output code and a targeted signal code (an ideal output code in which k is 1 (k=1)) and determines whether or not the output code coincides with the targeted signal code (Step S5). For example, when the differential voltage of "−VDD/4" is input as the inspection signal VC, an ideal output signal code (a target code) "63d" is compared with an actually detected output code. Here, when it is determined that an ideal output code (the target code) "63d" coincides with an actually detected output signal code (Step S5: YES), the procedure of adjusting the attenuation capacitance CHP ends.

On the other hand, when it is determined that the ideal output signal code (the target code) "63d" does not coincide with the actually detected output signal code (Step S5: NO), it is determined whether or not the actually detected output signal code is larger than the ideal output code (the target code) "63d" (Step S6). Here, when it is determined that the actually detected output code is larger than the ideal output code (the target code) "63d" (Step S6: YES), a capacitance code of the variable capacitance Ch2 is decremented, and the variable capacitance Ch2 is reduced (Step S7). Moreover, the process returns to Step S3, and in Step S5, the same process is repeated until the determination result that the ideal output signal code (the target code) "63d" coincides with the actually detected output signal code is obtained.

Also, in Step S6, when it is determined that the actually detected output code is smaller than the ideal output signal code (the target code) "63d" (Step S6: NO), the capacitance code of the variable capacitance Ch2 is incremented and the variable capacitance Ch2 is increased (Step S8). Moreover, the process returns to Step S3, and in Step S5, the same process is repeated until determination result that the ideal output signal code (the target code) "63d" coincides with the actually detected output code is obtained.

With the above-described series of processes, when it is determined that the ideal output signal code (the target code) "63d" substantially coincides with the actually detected output signal code, a capacitance code of the variable capacitance Ch2 set at this time is decided as a capacitance code used to provide an optimum variable capacitance Ch2. Thus, the capacitance value of the variable capacitance Ch2 is adjusted so that k=1, that is, Vfs,pp=VDD is satisfied. The attenuation capacitance control unit 123 sets the capacitance value of the variable capacitance Ch2 provided by the decided capacitance code as an adjustment value (Step S9) and ends the adjustment of the variable capacitance Ch2.

In the above-described adjustment procedure, the differential voltage of "−VDD/4" serving as a negative voltage is set as the inspection signal VC, but as understood from the characteristics of FIG. 7, a positive voltage may be set as the inspection signal VC. Furthermore, the absolute value of a voltage of the inspection signal VC needs not be limited to "VDD/4" and has only to be any voltage other than 0 V corresponding to the reference point.

Next, points of a process associated with the above-described adjustment procedure will be generalized.

(1) When the inspection signal VC exceeds 0 V and the output code is larger than the targeted signal code or when the inspection signal VC is less than 0 V and the output code is smaller than the targeted signal code, the attenuation capacitance control unit 123 determines that k is larger than 1 (k>1) (the characteristic indicated by the alternating single-dot-dash line of FIG. 7). In this case, the attenuation capacitance control unit 123 decrements the capacitance code of the variable capacitance Ch2 (Step S7), reduces the capacitance value of the variable capacitance Ch2, and causes A/D conversion to be performed again (Step S4).

(2) When the inspection signal VC exceeds 0 V and the output code is smaller than the targeted signal code or when the inspection signal VC is less than 0 V and the output code is larger than the targeted signal code, the attenuation capacitance control unit 123 determines that k is smaller than 1 (k<1) (the characteristic indicated by the broken line of FIG. 7). In this case, the attenuation capacitance control unit 123 increments the capacitance code of the variable capacitance Ch2 (Step S8), increases the capacitance value of the variable capacitance Ch2, and causes the A/D conversion to be performed again (Step S4).

(3) When the output code coincides with a target code, the attenuation capacitance control unit 123 determines that the capacitance value of the variable capacitance Ch2 is adjusted so that a condition that k is 1 (k=1) is satisfied and Vfs,pp=VDD is satisfied (the characteristic indicated by the solid line of FIG. 7), sets the capacitance value of the variable capacitance Ch2 as an adjustment value (Step S9), and ends the procedure of adjusting the variable capacitance Ch2.

According to the above-described first embodiment, an attenuation capacitance value can be adjusted to an optimum value to reduce an influence of the parasitic capacitance corresponding to a process variation and a temperature variation. Therefore, a successive approximation type A/D converter configured to secure a full scale range, operate with an optimum input dynamic range, and have little conversion error can be provided.

Second Embodiment

Next, a second embodiment of the present invention will be described.

Although one type of differential voltage "−VDD/4" is set as the inspection signal VC in the above-described first embodiment, a plurality of types of inspection signals VC (for example −3VDD/8, −VDD/8, +VDD/8, and +3VDD/8) are set in the second embodiment. Output codes obtained with respect to the plurality of types of inspection signals VC are compared with target codes and an increase or decrease in the capacitance value of the variable capacitance Ch2 is determined in accordance with a majority decision of a plurality of determination results.

Although the second embodiment uses the constitution of the successive approximation type A/D converter 100 according to the first embodiment, the first embodiment and the second embodiment differ in that procedure of adjusting the variable capacitance Ch2 using the plurality of types of inspection signals VC is different from that of the first embodiment. The other constitutions are the same as those of the first embodiment.

A procedure of adjusting a capacitance value of the variable capacitance Ch2 according to the second embodiment based on the adjustment principle will be described with reference to a flowchart shown in FIG. 9.

Figure 9:
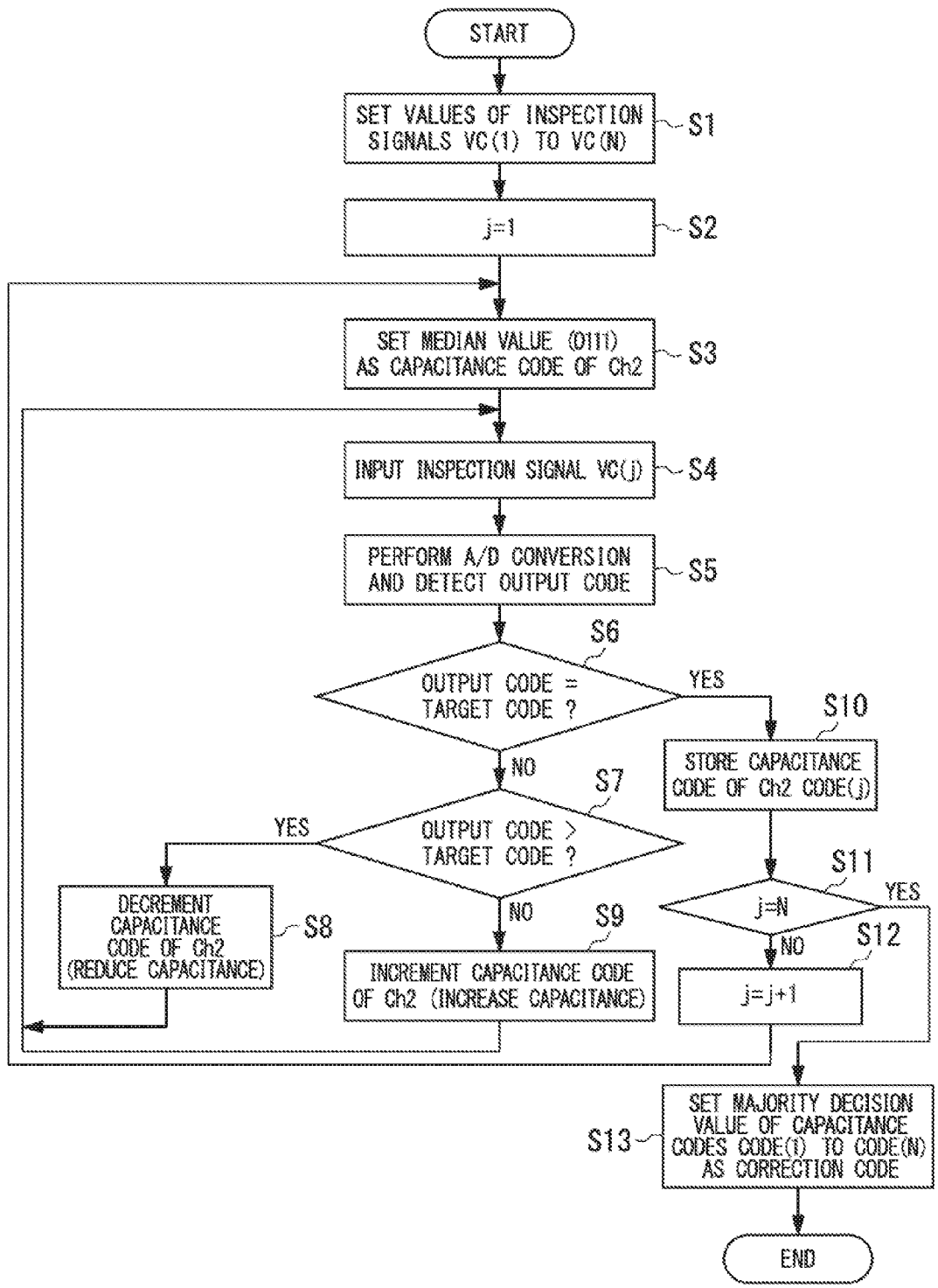
FIG. 9 is a flowchart showing an example of an operation of a successive approximation type A/D converter according to a second embodiment of the present invention.

FIG. 9 is a flowchart showing an example of an operation of a successive approximation type A/D converter according to the second embodiment of the present invention and is a diagram showing the procedure of adjusting the capacitance value of the variable capacitance Ch2.

The operator starts the next adjustment work after the successive approximation type A/D converter is activated.

First, the operator sets values of a plurality of inspection signals VC(1) to VC(j) (j is a natural number) input to the successive approximation type A/D converter. For example, the number of types of inspection signals VC is set to 4 (j=4), and for example, differential voltages "−3VDD/8," "−VDD/8," "+VDD/8," and "+3VDD/8" are set as values of inspection signals VC(1) to VC(4) (Step S1).

First, an adjustment operation is performed using the inspection signal VC(1) (j=1) to which a differential voltage of "−3VDD/8" is assigned (Step S2).

Subsequently, the capacitance value of the variable capacitance Ch2 is set to, for example, ½ of the total amount of the variable capacitance Ch2. In other words, a capacitance code of the variable capacitance Ch2 is set to "0111b" indicating a median value (Step S3).

Subsequently, the inspection signal (a pseudo signal) VC(1) is input to the successive approximation type A/D converter (Step S4).

Subsequently, the successive approximation type A/D converter performs A/D conversion and detects an output code at this time (Step S5).

Subsequently, a magnitude relation is determined by comparing an actually detected output code and a targeted signal code (an ideal output code in which k is 1 (k=1)) (Step S7). In this case, an expected output code, that is, an ideal output code for the inspection signal VC(1), to which the differential voltage of "−3VDD/8" is assigned, is "31d."

Here, when the inspection signal VC(1) exceeds 0 V and the output code is larger than the targeted signal code or when the inspection signal VC(1) is less than 0 V and the output code is smaller than the targeted signal code, it is determined that k is larger than 1 (k>1) (the characteristic indicated by the alternating single-dot-dash line of FIG. 7), the capacitance code of the variable capacitance Ch2 is decremented (Step S8), and the capacitance value of the variable capacitance Ch2 is reduced. Moreover, the A/D conversion is performed on the inspection signal VC(1) again (Step S5).

Also, when the inspection signal VC(1) exceeds 0 V and the output code is smaller than the targeted signal code or when the inspection signal VC(1) is less than 0 V and the output code is larger than the targeted signal code, it is determined that k is smaller than 1 (k<1) (the characteristic indicated by the broken line of FIG. 7), the capacitance code of the variable capacitance Ch2 is incremented (Step S9), and the capacitance value of the variable capacitance Ch2 is increased. Moreover, the A/D conversion is performed on the inspection signal VC(1) again (Step S5).

When it is determined that the output code coincides with the target code, it is determined that the variable capacitance Ch2 is adjusted so that a condition that k is 1 (k=1) is satisfied and Vfs,pp=VDD is satisfied (the characteristic indicated by the solid line of FIG. 7), and a capacitance code "CODE(j)" (j=1) of the variable capacitance Ch2 at this time is stored (Step S10).

Subsequently, it is determined whether or not a variable j reaches N (=4) (Step S11). When it is determined that the variable j does not reach N (Step S11: NO), the variable j is incremented (Step S12), and the same processes (Steps S3 to S12) are repeatedly performed on the remaining inspection signals VC(2) to VC(4) (j=2 to 4). Thus, capacitance codes "CODE(2)," "CODE(3)," and "CODE(4)" of the variable capacitance Ch2 are obtained and stored.

Subsequently, when it is determined that the variable j reaches N (Step S11: YES) and the capacitance codes "CODE(1) to CODE(4)" for the inspection signal VC(1) to VC(4) are obtained, a majority decision value of the obtained capacitance codes "CODE(1)" to "CODE(4)" is set as a capacitance code used to adjust the capacitance value of the variable capacitance Ch2 (Step S13) and the adjustment of the variable capacitance Ch2 ends.

According to the second embodiment, an influence of a quantum bit error at a time of A/D conversion is reduced and thus an attenuation capacitance can be adjusted with high accuracy. Therefore, a successive approximation type A/D converter configured to secure a full scale range with high accuracy, operate with an optimum input dynamic range, and have little conversion error can be provided.

Next, a third embodiment of the present invention will be described.

In the third embodiment, a successive approximation type A/D converter performs A/D conversion on one inspection signal VC a plurality of times and compares a plurality of output codes obtained through the A/D conversion performed the plurality of times with a target code to obtain a plurality of capacitance codes. Moreover, determination is made using a majority decision and an increase or decrease in capacitance value of a variable capacitance Ch2 is determined using a capacitance code having the largest number. The other constitutions are the same as those of the first embodiment or the second embodiment.

According to the third embodiment, an influence of a quantum bit error at a time of A/D conversion is further reduced and thus an attenuation capacitance can be adjusted with high accuracy. Therefore, a successive approximation type A/D converter configured to secure a full scale range with high accuracy operate with an optimum input dynamic range, and have little conversion error can be provided.

Next, a fourth embodiment of the present invention will be described.

A successive approximation type A/D converter according to the fourth embodiment includes a plurality of inspection signals VC, performs A/D conversion on each of the inspection signals VC a plurality of times, and compares a plurality of output codes obtained through the A/D conversion performed the plurality of times with a target code to obtain a plurality of capacitance codes. Moreover, determination is made using a majority decision and an increase or decrease in capacitance value of a variable capacitance Ch2 is determined using a capacitance code having the largest number. The other constitutions are the same as those of the first embodiment, the second embodiment, or the third embodiment.

According to the fourth embodiment, an influence of a quantum bit error at a time of A/D conversion is further reduced and thus an attenuation capacitance can be adjusted with high accuracy. Therefore, a successive approximation type A/D converter configured to secure a full scale range with higher accuracy, operate with an optimum input dynamic range, and have little conversion error can be provided.

Next, a fifth embodiment of the present invention will be described.

In the fifth embodiment, the above-described adjustment operations of the variable capacitances Ch2 in the first embodiment to the fourth embodiment are performed at a time of factory shipment of the successive approximation type A/D converters. In other words, the capacitance values of the variable capacitances Ch2 are adjusted so that a condition that Vfs,pp=VDD (k=1) is satisfied at the time of factory shipment. The other constitutions are the same as those of the first embodiment to the fourth embodiment.

According to the fifth embodiment, since an attenuation capacitance value is adjusted to an optimum value so that an influence of a parasitic capacitance is reduced in accordance with a process variation at the time of factory shipment, it is not necessary for the user to perform a task used to adjust the capacitance value of the variable capacitance Ch2. Therefore, a successive approximation type A/D converter configured to secure a full scale range, operate with an optimum input dynamic range, and have little conversion error at a stage at which the successive approximation type A/D converter is delivered to the user can be provided.

Next, an example of an operation of adjusting an attenuation capacitance in the related art will be described for reference to supplement effects of the above-described embodiments of the present invention.

Examples of a general method of adjusting an attenuation capacitance may include a method of performing adjustment when a layout is designed. According to such a method, a capacitance value of an attenuation capacitance CHP is set in consideration of an influence of a parasitic capacitance due to a metal wiring in advance when a layout is designed so that the differential input dynamic range Vfs,pp can outwardly be equal to the power supply voltage VDD, that is, the coefficient k can be 1. However, since temperature characteristics of an amount of variation of a unit capacitance and a parasitic capacitance between metal wirings due to a process variation are different from temperature characteristics of an amount of variation of a parasitic capacitance of a transistor, such amounts of variation are not offset. For this reason, it is difficult to set the differential input dynamic range Vfs,pp to be equal to the power supply voltage VDD using a layout design.

On the other hand, according to the above-described embodiments of the present invention, the capacitance value of the attenuation capacitance CHP is adjusted by switching on and off states of the switches SW1 to SW4 regardless of a layout design so that the differential input dynamic range Vfs,pp can be matched with the power supply voltage VDD. For this reason, a successive approximation type A/D converter capable of securing a full scale range and configured to operate with an optimum input dynamic range and have little conversion error can be provided.

Also, the dynamic comparison circuit 130 is introduced into the successive approximation type A/D converter and a MOM capacitance is used as the binary capacitances C0P to C7P and C0N to C7N so that a successive approximation type A/D converter having low power consumption can be realized.

While preferred embodiments of the invention have been described and shown above, it should be understood that these are exemplary of the invention and are not to be considered as limiting. Additions, omissions, substitutions, and other modifications can be made without departing from the spirit or scope of the present invention. Accordingly the invention is not to be considered as being limited by the foregoing description, and is only limited by the scope of the appended claims.

What is claimed is:

1. A successive approximation type A/D converter, comprising:
 a sampling circuit configured to sample a pair of analog signals constituting a differential input signal;
 a drive circuit configured to generate a reference signal;
 a capacitance circuit including an attenuation capacitance unit and a binary capacitance unit, both of the attenuation capacitance unit and the binary capacitance unit being connected to a signal node configured to hold the pair of analog signals sampled by the sampling circuit, and the capacitance circuit being configured to reflect a signal level of a reference signal in the pair of analog signals through the attenuation capacitance unit and the binary capacitance unit to generate a pair of voltage signals;
 a comparison circuit configured to compare one signal and the other signal constituting the pair of voltage signals; and
 a control circuit configured to sequentially determine a value of each bit of a digital signal including a plurality of bits and corresponding to the binary capacitance unit using a binary search method on the basis of the comparison result by the comparison circuit to reflect the value of each bit of the digital signal in the reference signal,
 wherein the binary capacitance unit is connected between the signal node and the drive circuit, and
 the attenuation capacitance unit includes
  a fixed capacitance unit connected between the signal node and a predetermined potential node; and
  a variable capacitance unit connected in series with a first switch between the signal node and the predetermined potential node while in parallel with the fixed capacitance unit, the variable capacitance unit being capable of adjusting a combined capacitance of the attenuation capacitance unit.

2. The successive approximation type A/D converter according to claim 1,
 wherein a capacitance of the fixed capacitance unit is smaller than a capacitance of the binary capacitance unit, and
 a combination of the capacitance of the binary capacitance unit, a parasitic capacitance generated in a common metal wiring of the binary capacitance unit, and an input capacitance of the comparison circuit is smaller than the combined capacitance of the fixed capacitance unit and the variable capacitance unit.

3. The successive approximation type A/D converter according to claim 1,
 wherein the binary capacitance unit includes:
  a plurality of capacitances, each of the plurality of capacitances being configured to be weighted by a binary number; and
  a plurality of second switches, each of the second switches being connected in series with one of the plurality of capacitances.

4. The successive approximation type A/D converter according to claim 1,
 wherein the attenuation capacitance unit includes a plurality of unit capacitance,
 the binary capacitance unit includes a plurality of unit capacitance, and
 a shape and a structure of the unit capacitance included in the attenuation capacitance unit are set in accordance with a shape and a structure of the unit capacitance included in the binary capacitance unit respectively.

5. The successive approximation type A/D converter according to claim 1 further includes an attenuation capacitance adjustment unit, wherein in order to cause a full scale range of the voltage signals to correspond to a full scale range of the digital signal, the attenuation capacitance adjustment unit is configured to adjust a capacitance value of the variable capacitance unit by selectively controlling on and off states of the plurality of the first switch, wherein a combined capacitance of the binary capacitance unit is equal to a combined capacitance of the binary capacitance unit, the attenuation capacitance unit, and a parasitic capacitance generated in a common metal wiring of the binary capacitance unit.

6. The successive approximation type A/D converter according to claim 5, wherein the attenuation capacitance adjustment unit is configured to set a combined capacitance of the fixed capacitance unit and the variable capacitance unit to be a median value of a variable range of the attenuation capacitance unit, and further adjust the capacitance of the variable capacitance unit so as to coincide an output code with a target code, the output code being output in responding to an inspection signal applied from the outside.

7. The successive approximation type A/D converter according to claim 6, wherein the attenuation capacitance adjustment unit is configured to store a plurality of states in which the output code coincides with the target code in responding to a plurality of the inspection signals as a plurality of capacitance codes, and determine a majority decision among the plurality of capacitance codes as a target capacitance code used for adjusting the capacitance value of the variable capacitance unit.

* * * * *